United States Patent [19]

Kinugawa et al.

[11] 4,238,276

[45] Dec. 9, 1980

[54] PROCESS FOR PRODUCING LIQUID CRYSTAL DISPLAY ELEMENT

[75] Inventors: Kiyoshige Kinugawa, Mobara; Satoru Ogihara, Hitachi; Yosio Hanada, Mobara; Shizuo Ishitani, Mobara; Tadashi Ishibashi, Mobara, all of Japan

[73] Assignee: Hitachi, Ltd., Japan

[21] Appl. No.: 21,185

[22] Filed: Mar. 16, 1979

[30] Foreign Application Priority Data

May 19, 1978 [JP] Japan .................................. 53-58930

[51] Int. Cl.$^3$ ............................................. C23F 1/02
[52] U.S. Cl. ................................... 156/634; 156/656; 156/659.1; 156/145; 427/108; 427/126.2; 427/270; 427/226; 29/830
[58] Field of Search ................. 156/99, 107, 145, 629, 156/633, 634, 654, 655, 656, 667, 659; 428/1; 427/108, 110, 93, 58, 126, 95, 264, 269, 270, 272, 287, 309, 383; 350/160 LC, 330–333; 430/20, 313, 315, 316, 318, 319

[56] References Cited

U.S. PATENT DOCUMENTS

| | | | |
|---|---|---|---|
| 2,959,499 | 11/1960 | Herczog et al. | 427/108 X |
| 3,928,658 | 12/1975 | Van Boxtel et al. | 156/656 X |
| 3,979,240 | 9/1976 | Ghezzo | 156/667 X |

*Primary Examiner*—William A. Powell
*Attorney, Agent, or Firm*—Craig & Antonelli

[57] ABSTRACT

A liquid crystal display element is produced by forming an electrical insulating metal oxide film on a transparent glass substrate, forming a transparent conductive film thereon by coating a coating solution prepared by diluting a solute comprising indium, tin, a $\beta$-diketone and nitric acid with an organic solvent, followed by calcination, etching the transparent conductive film to give electrodes having desired patterns, placing the two resulting glass substrates in parallel so that individual electrodes at the inner side stand opposite to each other, and enclosing a liquid crystal material in the space formed between the two glass substrates. The liquid crystal display element thus produced has transparent electrodes which have low sheet resistance, enhanced mechanical strength and strong adhesive strength to the glass substrate.

13 Claims, No Drawings

PROCESS FOR PRODUCING LIQUID CRYSTAL DISPLAY ELEMENT

This invention relates to a process for producing liquid crystal display elements with improved productivity.

In general, liquid crystal display elements are produced by forming a transparent conductive film having an electrode pattern on a substrate made of glass such as soda-lime glass, if necessary forming an orientation controlling film for orientating liquid crystal molecules on the electrode, placing the two glass substrates thus treated oppositely and enclosing a liquid crystal material therebetween.

As the transparent conductive film used in liquid crystal display elements, there have been known tin oxide films and indium oxide films. Tin oxide films are formed by the vapor phase growing method and the like and are good in productivity, but since it is very difficult to etch the tin oxide films or it is very difficult to form transparent electrodes having minute patterns by using them, they are unsuitable for applying to liquid crystal display elements having complicated electrode patterns. On the other hand, indium oxide films can be etched by using an aqueous solution of hydrochloric acid and nitric acid, so that electrodes having minute patterns can easily be produced. But since the indium oxide films are formed batchwise by vacuum evaporation with electric resistance heating or electron beam heating of indium oxide in vacuum, there is a problem in productivity. That is, operating time of one batch requires 60 to 120 minutes, which results in lowering in operating efficiency. This problem may be solved by installing more vacuum pumps, but plant investment will increase uneconomically. In addition, it is difficult to form a uniform thin film on a substrate having dimensions more than 100×100 mm, and thus the use of the indium oxide films is limited from the dimensions of substrates to be coated. In order to solve such a problem, there has been proposed a method for forming a transparent conductive indium oxide film by coating on a glass substrate a solution of compounds containing indium as a main component and calcining it. But according to this coating method, adhesion of the indium oxide film to the glass substrate was poor and the film strength was not good. Thus, the indium oxide film formed on the glass substrate was easily peeled off during the etching treatment for making the prescribed pattern after forming the indium oxide film or during the resist removing procedure for removing a resist film coated for conducting etching, and disconnection of electrode patterns often took place due to damage during the operation. Therefore, the coating method was not suitable for producing transparent conductive films having minute patterns used in liquid crystal display elements. For example, Japanese Patent Appln Kokai (Laid-Open) Nos. 1497/77 and 37763/77 disclose methods for forming transparent conductive films by the coating method, but there are problems in adhesion properties, strength of the films, and whitening phenomenon.

On the other hand, in order to improve adhesive strength of the indium oxide film to the glass substrate, the present inventors have tried to treat a glass substrate coated with a solution of compounds containing indium as a main component with heating at 600° C. or higher. But according to this method, although peeling of the transparent conductive film and disconnection of the electrodes were reduced considerably, since heat distortion temperature of soda-lime glass used as glass substrate is about 500° C., the glass substrate was deformed by the heating at 600° C. or more and the liquid crystal material could not be maintained between the electrodes having a uniform distance, which resulted in lowering in display properties of the liquid crystal display element. Further, the alkali metal ions in the soda-lime glass were dispersed in the indium oxide film to enhance sheet resistance remarkably, which resulted in making the electrodes useless.

As mentioned above, transparent conductive films which can be used as electrodes in liquid crystal display elements and which satisfy the desired properties have not been produced with excellent productivity according to known methods.

It is an object of this invention to provide a process for producing liquid crystal display elements having transparent conductive films which have low sheet resistance, strong adhesive strength to glass substrates and strong mechanical strength with excellent productivity overcoming disadvantages of the known methods.

This invention provides a process for producing a liquid crystal display element which comprises forming an electrical insulating metal oxide film on a transparent glass substrate, forming a transparent conductive film thereon by coating a coating solution prepared by diluting a solute comprising indium, tin, a $\beta$-diketone and nitric acid with an organic solvent, followed by calcination, etching the transparent conductive film to give electrodes having desired patterns, placing the two resulting glass substrates in parallel so that individual electrodes at the inner side stand opposite to each other, and enclosing a liquid crystal material in the space formed between the two glass substrates.

In the first place, the metal oxide film is formed on the glass substrate.

Soda-lime glass generally used contains large amounts of alkali metal ions such as sodium ions, potassium ions, etc. When soda-lime glass is used as a glass substrate and subjected to heat treatment, as in the case of being allowed to stand at room temperature, it is known that there takes place a phenomenon in which these alkali metal ions appear on the surface of the glass substrate with high concentrations. When an indium compound is coated on such a glass substrate on which alkali metal ions are present in high concentrations, the alkali metal ions disperse in the indium oxide film during or after the calcination, which results in lowering in chemical resistance of the film and in making the film easily peeled off from the glass substrate. In addition, the alkali metal ions often increase sheet resistance of the indium oxide film remarkably up to 300 k$\Omega$/square. When a stable metal oxide film is formed on the glass substrate and a solution of indium compound is coated thereon and calcined, adhesive strength of the indium oxide film can be increased remarkably and at the same time sheet resistance of the film can also be lowered greatly. As the metal oxide film, there can be used films of silicon oxide, titanium oxide, aluminium oxide, zirconium oxide, magnesium oxide, nickel oxide, etc. These metal oxides can be used alone or as a mixture of two or more of them in order to form the metal oxide film. As to film forming methods, there can be used conventional methods such as vacuum evaporation method, vapor phase growing method, sputtering method, coating method and the like.

The coating solution for forming the transparent conductive film on the metal oxide film is prepared by diluting a solute comprising indium, tin, a β-diketone and nitric acid with an organic solvent. When hydrochloric acid is used in place of nitric acid, since a chloride is hardly decomposed, chlorine ions are easily retained in the resulting transparent conductive film, which results in lowering in alkali resistance and in strength of the film itself. On the contrary, when nitric acid is used, since a nitrate is easily decomposed by heating in general and has stronger oxidative effect, there are many advantages in that oxides of indium and tin can easily be formed, oxidative decomposition of organic molecules can easily take place, and the like. When acetylacetone is used as a β-diketone, the solute seems to be composed of the compounds having the following structural formulae, which function effectively for producing a coating film:

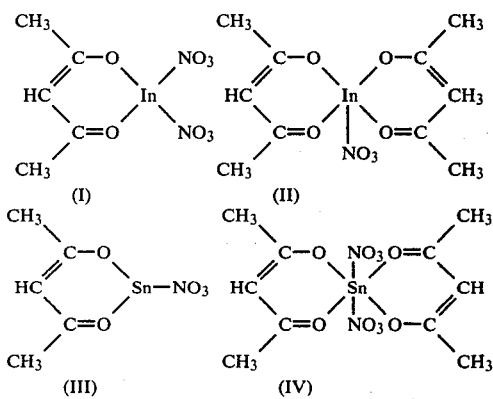

After the calcination, tin oxide is properly mixed with indium oxide to remarkably improve properties such as sheet resistance and adhesion strength. In the case of forming the solute of the coating solution, when tin is reacted with nitric acid in the presence of a βdiketone, dissolution of tin can effectively be conducted. That is, if tin is directly dissolved in a nitric acid solution, produced tin nitrates (Sn(NO3)2 and Sn(NO3)4) are immediately reacted with water to give precipitates such as stannous hydroxide (Sn(OH)2) and stannic hydroxide (Sn(OH)4), which results in insufficient dissolution of tin. On the other hand, in the case of using acetylacetone as a β-diketone, acetylacetone is present as shown in the following structural formula:

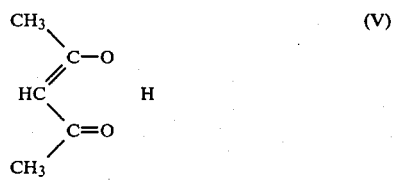

In such a state, the hydrogen atom is unstable and easily separated and can be replaced by other ion. When tin is reacted with nitric acid in the presence of acetylacetone, produced tin nitrate liberates tin ions and nitrate ions, so that tin ion takes the position of the hydrogen atom in the structural formula (V) of acetylacetone to give such compounds as shown in the structural formulae (III) and (IV). Thus tin seems to be almost completely dissolved in the solution.

In the case of using indium, tin, acetylacetone and nitric acid, indium can be added to the solution at any order but each component has a preferable range as to its amount. It is preferable to use 1 part by weight of indium, 1.3 to 9.0 parts by weight of acetylacetone and 1.0 to 6.0 parts by weight of nitric acid. If the amount of acetylacetone is less than 1.3 parts by weight or the amount of nitric acid is less than 1.0 part by weight per part by weight of indium, indium or tin cannot be dissolved sufficiently, which results in giving an unfavorable coating solution. On the other hand, if the amount of acetylacetone is more than 9.0 parts by weight or the amount of nitric acid is more than 6.0 parts by weight per part by weight of indium, no uniform transparent conductive film can be obtained after calcination due to the generation of a large number of pinholes. Weight ratio of tin/indium is preferably in the range of 0.01/1 to 0.30/1 to give sheet resistance of less than 10 kΩ/square.

As the organic solvent, there can be used methanol, ethanol, acetone, etc. alone or as a mixture of two or more of them.

Weight ratio of the solute to the organic solvent is preferably in the range of 1/1 to 1/20.

The coating solution thus prepared is coated on the glass substrate, the surface of which is covered by a metal oxide film such as silicon oxide film by using a conventional method such as the dipping method, and the like.

The transparent conducting film can be formed by calcining the coating solution coated on the glass substrate as mentioned above. The calcination method is not limited and any conventional methods can be applied, but a more preferable calcining method is as follows.

The glass substrate coated with the coating solution is calcined via a series of steps comprising: a provisional drying step in which the coated substrate is dried at a temperature of 35° to 100° C.; a temperature rise step in which the coated substrate is heated at a temperature rise rate of 20° C./min or more up to 400° C. or higher; and a calcination step in which the coated substrate is calcined at a temperature of 400° C. or higher.

When the coated substrate is subjected to the provisional drying step, it can be allowed to stand for several tens hours without changing its properties, so that to have the provisional drying step is very advantageous from the viewpoint of processability. The temperature of the provisional drying step is 35° to 100° C., preferably 45° to 70° C., in order to vaporize the organic solvent.

In the temperature rise step, the greater the temperature rise rate becomes, the harder the transparent conductive film becomes. At the same time, sheet resistance of the transparent conductive film becomes lower. Surface hardness of the film increases remarkably when the temperature rise rate becomes 20° C./min or more, preferably 100° C./min or more.

The temperature of the calcination step is 400° C. or higher, and the most preferable one is about 500° C. Too high calcination temperature is not preferable because of the deformation of the glass substrate to be treated. For example, in the case of soda-lime glass, upper limit of the calcination temperature is about 530° C. due to its deformation. Organic compounds are generally decomposed over 400° C., so that unnecessary organic compounds disappear during the calcination.

Etching of the transparent conductive film can be carried out by using a conventional method. For example, a resist film is printed on the transparent conductive film with desired patterns and the surface of the conductive film is treated with an etching solution comprising, for example, 1 part by weight of hydrochloric acid, 0.1 part by weight of nitric acid and 1 part by weight of water. The portions on which no resist is printed are removed by the etching treatment. Subsequently, the resist film is removed by a 5% NaOH aqueous solution to give transparent electrodes having the desired patterns.

If necessary, an orientation controlling film for controlling the orientation of the liquid crystal molecules may be formed on the electrodes. Such an orientation controlling film e.g. a silicon oxide film, can be formed by the so-called oblique vacuum evaporation method.

Subsequently, the periphery of the thus treated glass substrate is coated with an organic adhesive for sealing by a conventional method such as a printing method. Then the two resulting glass substrates are placed in parallel so that individual electrodes at the inner side stand opposite to each other at a distance of, for example, 5–15 $\mu$m. The periphery of each glass substrate is then adhered to each other except for one opening for pouring a liquid crystal material into the space thus produced.

A liquid crystal material is enclosed in the space thus formed between the two glass substrates from the opening by, for example, the vacuum enclosing method. The opening is then closed by using an adhesive.

In the next place, when polarizing plates are attached to each outside of the glass substrates and a reflecting plate is attached to the outside of a polarizing plate, there can be obtained a reflection type liquid crystal display element. The process of this invention can also be applied to producing transmission type twisted nematic liquid crystal display elements, as well as other display modes such as phase-transition type liquid crystal display elements.

This invention is illustrated in more detail by way of the following Examples, in which all parts and percents are by weight unless otherwise specified.

EXAMPLE 1

A glass substrate made of soda-lime glass and having dimensions of 100×100×1 mm is dipped in an alcohol solution of silicon hydroxide (OCD Si-59000, manufactured by Tokyo Ohka Kogyo Ltd.) to coat a silicon oxide film on the glass substrate and calcined at 500° C. for 1 hour. An electrical insulating silicon oxide ($SiO_2$) film having a thickness of about 1000 Å is formed on the glass substrate. On the other hand, a solution A is prepared by dissolving 1 part of indium nitrate in 1 part of acetylacetone. A solution B in an amount of 0.3 part is prepared by charging tin in a mixed solution of acetylacetone and nitric acid and carrying out the reaction of tin with nitric acid in the presence of acetylacetone so as to dissolve tin in the solution. The solution A is mixed with the solution B to give a solute. A coating solution for forming a transparent conductive film is prepared by diluting the solute with an organic solvent containing acetone mainly about 7 times as much as the original solute amount. The resulting coating solution is coated on the silicon oxide film by the spin coating method. Then the coated substrate is calcined at 500° C. for 1 hour to form a transparent conductive film having a thickness of about 500 Å. A resist film is printed with desired patterns on the transparent conductive film, which is then treated with an etching solution comprising 1 part of hydrochloric acid, 0.1 part of nitric acid and 1 part of water to remove portions of the conductive film on which no resist is printed. Subsequently, the resist film is removed by a 5% NaOH aqueous solution to give transparent electrodes having the desired patterns. If desired, an orientation controlling film of silicon oxide for controlling the orientation of the liquid crystal molecules is formed by the oblique vacuum evaporation method on the electrodes. Subsequently, the periphery of the glass substrate is printed with an organic adhesive for sealing. The resulting glass substrate is placed in parallel to another glass substrate treated in the same manner as mentioned above so that individual electrodes at the inner side stand opposite to each other at a distance of 5–15 $\mu$m and sealed with the adhesive except for one opening to form a closed space. A liquid crystal material is enclosed in the space thus formed from the opening by the vacuum enclosing method. The opening is closed by using an adhesive. Each one polarizing plate is attached to each outside of the glass substrates and a reflecting plate is attached to the outside of a polarizing plate to give a liquid crystal display element.

The transparent conductive film electrodes of this liquid crystal display element have sheet resistance of as low as 1 k$\Omega$/square. Further, hardness of the transparent electrodes is so excellent that no damage is observed after rubbing according to the rubbing test defined in MIL STD (Military Standard, C-6-75A, items 4, 6 and 11). In addition, adhesive strength of the electrodes to the glass substrate is sufficient and thus there takes place no disconnection of the electrodes.

In the preparation of the solution B, nitric acid can be added to a mixture of acetylacetone and tin, in place of the order of adding individual components mentioned above.

EXAMPLE 2

On a glass substrate made of soda-lime glass and having dimensions of 100×100×1 mm, a silicon oxide film having a thickness of about 1000 Å is formed by the vacuum evaporation method. On the other hand, a solute is prepared by adding tin to a mixed solution of acetylacetone and nitric acid, carrying out the reaction of tin with nitric acid in the presence of acetylacetone so as to dissolve tin, and adding indium thereto. The solute comprises 1 part of indium, 0.1 part of tin, 2.5 parts of acetylacetone and 5 parts of nitric acid. A coating solution for forming a transparent conductive film is prepared by diluting the solute with an organic solvent containing more than 80% of a mixed solution of methanol and acetone (1:1 by weight) about 7 times as much as the original solute amount. The resulting coating solution is coated on the glass substrate covered by the silicon oxide film by the dipping method. The resulting coated substrate is subjected to provisional drying at 55° C. for about 10 minutes and then rapidly put in a calcining furnace previously controlled at 500° C. and filled with nitrogen. In the furnace, the coated substrate is heated at a temperature rise rate of 100° C./min and calcined at 500° C. for 1 hour to form a transparent conductive film. Subsequently, the same procedures as described in Example 1 are repeated to give a liquid crystal display element.

The transparent conductive film electrodes in the resulting liquid crystal display element have sufficiently low sheet resistance and strong adhesive strength to the substrate.

According to the process of this invention, since the electrical insulating metal oxide film is formed on the glass substrate, contamination of alkali metal ions from the glass substrate can sufficiently be prevented. Further, since a proper amount of tin oxide is added to indium oxide, the resulting transparent electrodes have sufficiently low sheet resistance, increased mechanical strength, and strong adhesive strength to the glass substrate. Further, physical and chemical properties of the transparent electrodes are improved remarkably as mentioned above, so that no disconnection of the electrodes takes place even if the electrodes have minute patterns. In addition, since the transparent conductive film (electrodes) can be formed by the coating method on the glass substrate, the process of this invention is suitable for mass production of liquid crystal display elements with low cost.

What is claimed is:

1. A process for producing a liquid crystal display element which comprises forming an electrical insulating metal oxide film on a transparent glass substrate, forming a transparent conductive film thereon by coating a coating solution prepared by diluting a solute comprising indium, tin, a β-diketone and nitric acid with an organic solvent, followed by calcination, etching the transparent conductive film to give a first composite having electrodes having desired patterns, performing said forming an electrical insulating metal oxide film step, said forming a transparent conductive film step, and said etching step on a second transparent glass substrate to give a second composite having electrodes having desired patterns, placing the two resulting composites spaced from each other and in parallel so that the electrodes of each composite are positioned at the inner side of the display element and stand opposite to each other, and enclosing a liquid crystal material in the space formed between the two composites.

2. A process according to claim 1, wherein the metal oxide film is a silicon oxide film.

3. A process according to claim 1, wherein the metal oxide film is formed by coating an organic solvent containing silicon hydroxide on the glass substrate and calcining.

4. A process according to claim 1, wherein the solute comprises 1 part by weight of indium, 0.01 to 0.30 part by weight of tin, 1.3 to 9.0 parts by weight of acetylacetone and 1.0 to 6.0 parts by weight of nitric acid.

5. A process according to claim 1, wherein the organic solvent used for diluting the solute is methanol, ethanol, or acetone, or a mixture of two or more of them.

6. A process according to claim 1, wherein the transparent conductive film is formed by coating the coating solution on the glass substrate covered with the metal oxide film and subjecting it to a provisional drying step in which the coated substrate is dried at a temperature of 35° to 100° C., to a temperature rise step in which the coated substrate is heated at a temperature rise rate of 20° C./min or more up to 400° C. or higher, and to a calcination step in which the coated substrate is calcined at a temperature of 400° C. or higher.

7. A process according to claim 1, wherein the transparent glass substrate is made of soda-lime glass.

8. A process according to claim 1, wherein the metal oxide film is made of material selected from the group consisting of silicon oxide, titanium oxide, aluminium oxide, zirconium oxide, magnesium oxide, nickel oxide, and mixtures thereof.

9. A process according to claim 1, wherein the weight ratio of said solute to said organic solvent is 1/1 to 1/20.

10. A process according to claim 1, wherein the two resulting composites are spaced from each other a distance of between 5–15 μm.

11. A process according to claim 6, wherein said provisional drying step is at a temperature of 45° to 70° C.

12. A process according to claim 6, wherein said temperature rise step is at least 100° C./min.

13. A process according to claim 6, wherein the calcination step is at a temperature of at most 530° C.

* * * * *